United States Patent
Daimon

(10) Patent No.: US 11,611,327 B2
(45) Date of Patent: Mar. 21, 2023

(54) ACOUSTIC WAVE DEVICE

(71) Applicant: Murata Manufacturing Co., Ltd., Nagaokakyo (JP)

(72) Inventor: Katsuya Daimon, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 327 days.

(21) Appl. No.: 16/911,438

(22) Filed: Jun. 25, 2020

(65) Prior Publication Data
US 2020/0328727 A1 Oct. 15, 2020

Related U.S. Application Data

(63) Continuation of application No. PCT/JP2019/000513, filed on Jan. 10, 2019.

(30) Foreign Application Priority Data

Jan. 11, 2018 (JP) .............................. JP2018-002347

(51) Int. Cl.
*H03H 9/145* (2006.01)
*H03H 9/02* (2006.01)

(52) U.S. Cl.
CPC ...... *H03H 9/14547* (2013.01); *H03H 9/0211* (2013.01); *H03H 9/02015* (2013.01)

(58) Field of Classification Search
CPC ........... H03H 9/14547; H03H 9/02015; H03H 9/0211; H03H 9/02559; H03H 9/02818; H03H 9/02992; H03H 9/02574; H03H 9/25; H03H 9/14541
See application file for complete search history.

(56) References Cited

U.S. PATENT DOCUMENTS

| 7,939,987 | B1 | 5/2011 | Solal et al. |
| 2013/0051588 | A1 | 2/2013 | Ruile et al. |
| 2013/0249647 | A1 | 9/2013 | Nakanishi et al. |
| 2015/0102705 | A1* | 4/2015 | Iwamoto ............... H03H 9/171 310/313 B |

(Continued)

FOREIGN PATENT DOCUMENTS

| JP | 2013-518455 A | 5/2013 |
| JP | 2013-544041 A | 12/2013 |

(Continued)

OTHER PUBLICATIONS

Official Communication issued in International Patent Application No. PCT/JP2019/000513, dated Feb. 19, 2019.

*Primary Examiner* — Jeffrey M Shin
(74) *Attorney, Agent, or Firm* — Keating & Bennett, LLP

(57) ABSTRACT

An acoustic wave device includes a piezoelectric substrate a reverse-velocity surface of which is convex, an interdigital transducer electrode disposed on the piezoelectric substrate, and mass addition films stacked above the interdigital transducer electrode. The interdigital transducer electrode includes a central region, first and second edge regions, first and second gap regions located outside the first and second edge regions, first and second inner busbar regions, and first and second outer busbar regions. The mass addition films are stacked in at least the first and second edge regions and the first and second inner busbar regions.

19 Claims, 11 Drawing Sheets

(56) References Cited

U.S. PATENT DOCUMENTS

| | | | |
|---|---|---|---|
| 2016/0072475 A1* | 3/2016 | Mimura | H03H 9/02992 |
| | | | 333/195 |
| 2016/0182010 A1 | 6/2016 | Nakamura et al. | |
| 2017/0279433 A1* | 9/2017 | Matsukura | H03H 9/64 |
| 2018/0159497 A1 | 6/2018 | Iwamoto et al. | |

FOREIGN PATENT DOCUMENTS

| | | |
|---|---|---|
| JP | 2016-119569 A | 6/2016 |
| JP | 2017-175276 A | 9/2017 |
| WO | 2014/192756 A1 | 12/2014 |
| WO | 2017/043427 A1 | 3/2017 |

* cited by examiner

ACOUSTIC WAVE DEVICE

CROSS REFERENCE TO RELATED APPLICATIONS

This application claims the benefit of priority to Japanese Patent Application No. 2018-002347 filed on Jan. 11, 2018 and is a Continuation Application of PCT Application No. PCT/JP2019/000513 filed on Jan. 10, 2019. The entire contents of each application are hereby incorporated herein by reference.

BACKGROUND OF THE INVENTION

1. Field of the Invention

The present invention relates to an acoustic wave device.

2. Description of the Related Art

Acoustic wave devices are commonly used for filters of cellular phones. In Japanese Unexamined Patent Application Publication No. 2013-518455, an acoustic wave device that uses a piston mode is disclosed by way of example. An interdigital transducer electrode of the acoustic wave device has a central excitation region, inner edge regions adjacent to both sides of the central excitation region, and outer edge regions adjacent to the inner edge regions. A mass addition film is disposed in each inner edge region, and the electrode finger width of the inner edge region is increased to reduce an acoustic velocity in the inner edge region. In this way, the acoustic velocities in the above regions are differentiated from each other to inhibit a transverse mode.

For the acoustic wave device disclosed in Japanese Unexamined Patent Application Publication No. 2013-518455, the effect of inhibiting the transverse mode by using the piston mode greatly depends on the acoustic velocity in each inner edge region. In practice, however, the shape of the inner edge region of the interdigital transducer electrode and the shape of the mass addition film have manufacturing variations, and the acoustic velocity in the inner edge region cannot be sufficiently reduced in some cases. In these cases, the acoustic velocities in the above regions cannot be sufficiently differentiated, and the transverse mode cannot be sufficiently inhibited.

SUMMARY OF THE INVENTION

Preferred embodiments of the present invention provide acoustic wave devices that are each able to reduce or prevent a transverse mode with more certainty.

An acoustic wave device according to a preferred embodiment of the present invention includes a piezoelectric substrate, a reverse-velocity surface of which is convex, an interdigital transducer electrode that is disposed on the piezoelectric substrate, and a mass addition film that is stacked above a portion of the interdigital transducer electrode. The interdigital transducer electrode includes a first busbar and a second busbar that face each other, first electrode fingers each of which includes an end that is connected to the first busbar, and second electrode fingers each of which includes an end that is connected to the second busbar, and the second electrode fingers being interdigitated with respect to the first electrode fingers. An intersection region is defined as a region in which the first electrode fingers and the second electrode fingers overlap in a first direction, where the first direction is a direction in which an acoustic wave propagates, and a second direction is a direction perpendicular or substantially perpendicular to the first direction. The intersection region includes a central region that is located at a center or approximate center in the second direction, a first edge region that is located between the central region and the first busbar, and a second edge region that is located between the central region and the second busbar. The interdigital transducer electrode includes a first gap region that is located between the first edge region and the first busbar, and a second gap region that is located between the second edge region and the second busbar. The first busbar includes a first inner busbar region that is located adjacent the first gap region and a first outer busbar region that is located outside the first inner busbar region in the second direction. The second busbar includes a second inner busbar region that is located adjacent the second gap region, a second outer busbar region that is located outside the second inner busbar region in the second direction, and the mass addition film is stacked in at least the first edge region, the second edge region, the first inner busbar region, and the second inner busbar region.

Preferred embodiments of the present invention are each able to provide an acoustic wave device that is able to reduce or prevent a transverse mode with more certainty.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Preferred embodiments of the present invention will be described below with reference to the drawings to clarify the present invention.

The preferred embodiments are described by way of example in the present specification. It is pointed out that features can be partially replaced or combined between the different preferred embodiments.

Figure 1:
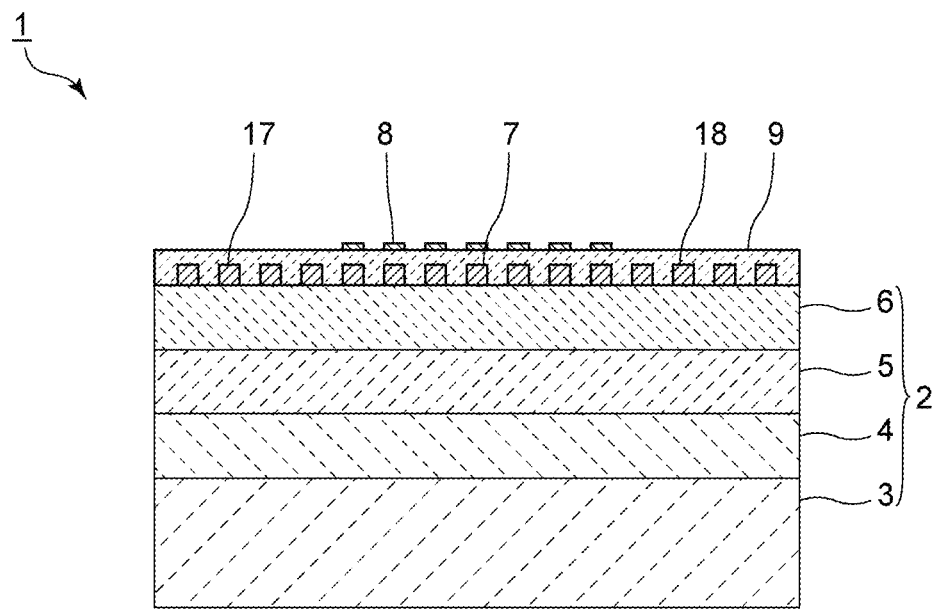
FIG. 1 is a sectional front view of an acoustic wave device according to a first preferred embodiment of the present invention.

FIG. 1 is a sectional front view of an acoustic wave device according to a first preferred embodiment of the present invention. FIG. 1 illustrates a section of a first edge region described later.

An acoustic wave device 1 includes a piezoelectric substrate 2. According to the present preferred embodiment, an interdigital transducer electrode 7 is disposed on the piezoelectric substrate 2. An alternating voltage is applied to the interdigital transducer electrode 7 to excite an acoustic wave.

A reverse-velocity surface of the piezoelectric substrate 2 is convex. That the reverse-velocity surface is convex means that $k_X^2+(1+\Gamma) \times k_Y^2=k_0^2$ and $\Gamma>-1$ are satisfied, where $k_X$ is a component of a wavenumber vector in a longitudinal direction, $k_Y$ is a component of the wavenumber vector in a transverse direction, and $k_0$ is the wavenumber vector in a main propagation direction. Otherwise, when $k_Y/k_0=\pm\text{sqrt}(-C2/2\times C4\pm(\text{sqrt}(1/C4\times k_X/k_0+(C22-4C4)/4C42)))$, $x<(\mu/\phi)$ is satisfied, where $y=k_Y/k_0$, $x=k_X/k_0$, $\phi=1/C4$, $\mu=(C22-4C4)/4C42$. Here, C4 and C2 are coefficients of a quartic equation $x=C4y^4+C3y^3+C2y^2+C1y+A$ using x and y described above.

According to the present preferred embodiment, the piezoelectric substrate 2 includes a multilayer body including a support substrate 3, a high acoustic velocity film 4 as a high acoustic velocity member, a low acoustic velocity film 5, and a piezoelectric layer 6 that are stacked in this order. According to the present preferred embodiment, the piezoelectric layer 6 is preferably made of, for example, lithium tantalate. The interdigital transducer electrode 7 is disposed on the piezoelectric layer 6.

Examples of the material of the support substrate 3 include piezoelectric materials such as lithium tantalate, lithium niobate, and crystal, ceramics such as alumina, zirconia, cordierite, mullite, steatite, and forsterite, glass, spinel, aluminum nitride, aluminum oxide, silicon carbide, silicon nitride, silicon oxynitride, a DLC film, silicon, sapphire, diamond, magnesia, a material that includes any of the above materials as a main component, and a material that includes a mixture of any of the above materials as a main component. The material of the support substrate 3 is not limited to the above description.

The acoustic velocity of a bulk wave that propagates through the high acoustic velocity film 4 is higher than the acoustic velocity of an acoustic wave that propagates through the piezoelectric layer 6. Examples of the material of the high acoustic velocity film 4 include aluminum nitride, aluminum oxide, silicon carbide, silicon nitride, silicon oxynitride, silicon, a DLC film, silicon, sapphire, piezoelectric materials such as lithium tantalate, lithium niobate, and crystal, ceramics such as alumina, zirconia, cordierite, mullite, steatite, and forsterite, diamond, magnesia, a material that includes any of the above materials as a main component, and a material that includes a mixture of any of the above materials as a main component. It suffices that the material of the high acoustic velocity film 4 is a material that has a relatively high acoustic velocity.

The acoustic velocity of a bulk wave that propagates through the low acoustic velocity film 5 is lower than the acoustic velocity of a bulk wave that propagates through the piezoelectric layer 6. Examples of the material of the low acoustic velocity film 5 include silicon oxide, glass, silicon oxynitride, tantalum oxide, and a material that includes a compound of silicon oxide and fluorine, carbon, or boron as a main component. It suffices that the material of the low acoustic velocity film 5 is a material that has a relatively low acoustic velocity.

As illustrated in FIG. 1, a reflector 17 and a reflector 18 are disposed along both sides of the interdigital transducer electrode 7 in a direction in which the acoustic wave propagates. Accordingly, the acoustic wave device 1 according to the present preferred embodiment is an acoustic wave resonator.

The interdigital transducer electrode 7 includes a multilayer metal film including, for example, a NiCr layer, a Pt layer, a Ti layer, an AlCu layer, and a Ti layer that are stacked in this order from the piezoelectric substrate 2. The reflector 17 and the reflector 18 are made of the same material as the interdigital transducer electrode 7. The materials of the interdigital transducer electrode 7, the reflector 17, and the reflector 18 are not limited to the above description. The interdigital transducer electrode 7, the reflector 17, and the reflector 18 may include a metal film including a single layer, for example.

A dielectric film 9 is disposed on the piezoelectric substrate 2 and covers the interdigital transducer electrode 7. The dielectric film 9 is made of, for example, silicon oxide expressed as $SiO_x$. According to the present preferred embodiment, the dielectric film 9 is preferably made of, for example, $SiO_2$ where x=2. Since the dielectric film 9 covers the interdigital transducer electrode 7, the interdigital transducer electrode 7 is unlikely to be damaged. In addition, the dielectric film 9 that is made of silicon oxide enables frequency and temperature characteristics to be improved. The dielectric film 9 may be made of silicon oxide where x is a numerical value other than 2 or may be made of a material other than silicon oxide, such as tantalum pentoxide, for example. The dielectric film 9 may be a multilayer film. However, the dielectric film 9 is not necessarily provided.

Regarding the acoustic wave device 1 according to the present preferred embodiment, the piezoelectric substrate 2 has a structure including the high acoustic velocity film 4, the low acoustic velocity film 5, and the piezoelectric layer 6 that are stacked. Accordingly, the energy of the acoustic wave can be effectively confined within the piezoelectric layer 6 or the vicinity thereof.

Figure 2:
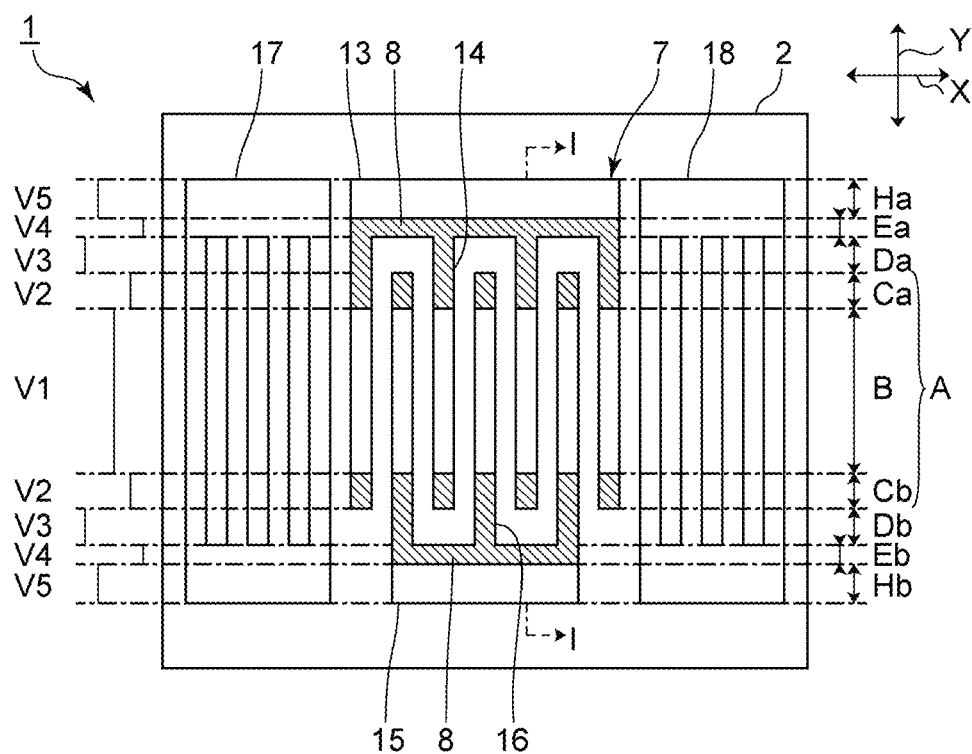
FIG. 2 is a plan view of the acoustic wave device according to the first preferred embodiment of the present invention.

FIG. 2 is a plan view of the acoustic wave device according to the first preferred embodiment. In FIG. 2, mass addition films described later are illustrated by hatching. In FIG. 2, the dielectric film is omitted.

The interdigital transducer electrode 7 includes a first busbar 13 and a second busbar 15 that face each other. The interdigital transducer electrode 7 includes first electrode fingers 14 each of which includes an end that is connected to the first busbar 13. The interdigital transducer electrode 7 also includes second electrode fingers 16 each of which includes an end that is connected to the second busbar 15. The first electrode fingers 14 and the second electrode fingers 16 are interdigitated with respect to each other.

The direction in which the acoustic wave propagates is referred to as a first direction X. A direction perpendicular or substantially perpendicular to the first direction X is referred to as a second direction Y. An intersection region A is defined as a region of the interdigital transducer electrode 7 in which the first electrode fingers 14 and the second electrode fingers 16 overlap in the first direction X. The intersection region A includes a central region B that is located at the center or approximate center in the second direction Y, and a first edge region Ca and a second edge region Cb that are located along both sides of the central region B in the second direction Y. The first edge region Ca is located between the central region B and the first busbar 13. The second edge region Cb is located between the central region B and the second busbar 15.

The interdigital transducer electrode 7 includes a first gap region Da that is located between the first edge region Ca and the first busbar 13 and a second gap region Db that is located between the second edge region Cb and the second busbar 15. Of the first electrode fingers 14 and the second electrode fingers 16, only the first electrode fingers 14 are located in the first gap region Da. Of the first electrode fingers 14 and the second electrode fingers 16, only the second electrode fingers 16 are located in the second gap region Db.

The first busbar 13 includes a first inner busbar region Ea that is located adjacent the first gap region Da and a first outer busbar region Ha that is located outside the first inner busbar region Ea in the second direction Y. The first inner busbar region Ea and the first outer busbar region Ha are connected to each other.

The second busbar 15 includes a second inner busbar region Eb that is located adjacent the second gap region Db and a second outer busbar region Hb that is located outside the second inner busbar region Eb in the second direction Y. The second inner busbar region Eb and the second outer busbar region Hb are connected to each other.

Mass addition films 8 are stacked above the first electrode fingers 14 and the second electrode fingers 16 in the first edge region Ca, the second edge region Cb, the first gap region Da, and the second gap region Db. The mass addition films 8 are also stacked above the first busbar 13 in the first inner busbar region Ea and above the second busbar 15 in the second inner busbar region Eb. According to the present preferred embodiment, the mass addition films 8 are not stacked above the interdigital transducer electrode 7 in the central region B, the first outer busbar region Ha, and the second outer busbar region Hb. The mass addition films 8 are thus stacked above portions of the interdigital transducer electrode 7.

Figure 3:
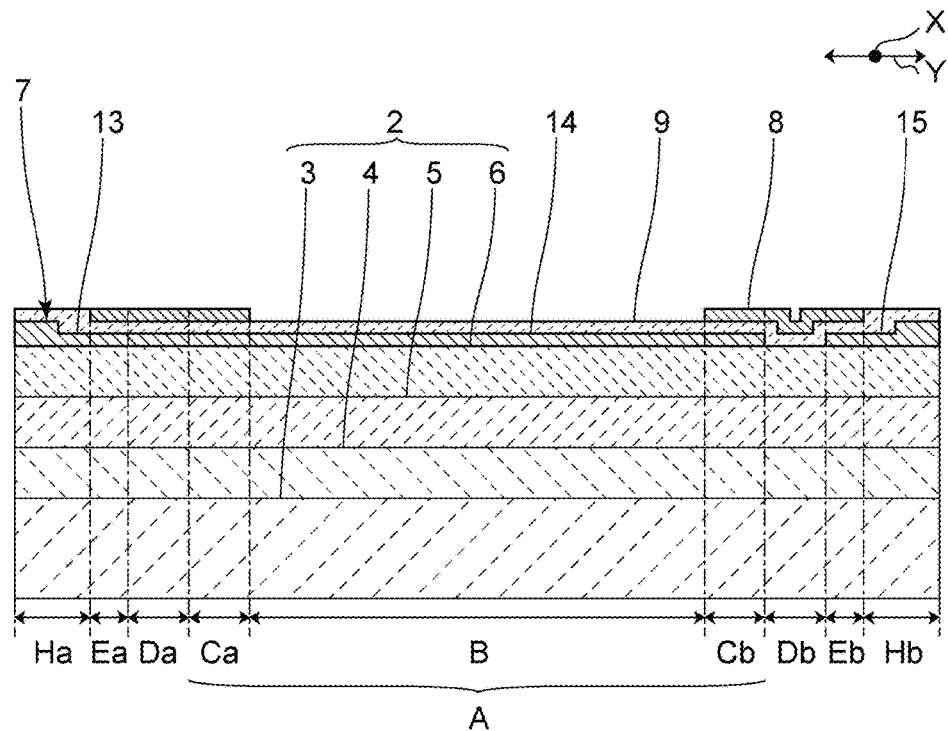
FIG. 3 is a sectional view taken along line I-I in FIG. 2.

FIG. 3 is a sectional view taken along line I-I in FIG. 2.

The piezoelectric substrate 2, the interdigital transducer electrode 7, and the mass addition films 8 are stacked in this order. More specifically, the mass addition films 8 are indirectly stacked above the interdigital transducer electrode 7 with the dielectric film 9 interposed therebetween. The mass addition films 8 may be directly stacked on the interdigital transducer electrode 7. The mass addition films 8 may be stacked between the piezoelectric substrate 2 and the interdigital transducer electrode 7. The mass addition films 8 are preferably made of metal, for example. However, the mass addition films 8 may be made of a dielectric material, for example.

According to the present preferred embodiment, the film thickness of the first busbar 13 in a portion of the first outer busbar region Ha is more than that of the other portion. Similarly, the film thickness of the second busbar 15 in a portion of the second outer busbar region Hb is more than that of the other portion. This enables the electric resistance of the interdigital transducer electrode 7 to be reduced. However, the film thicknesses of the first busbar 13 and the second busbar 15 may be constant or substantially constant.

As illustrated in FIG. 2, since the mass addition films 8 are stacked in the first edge region Ca and the second edge region Cb, the acoustic velocity in the first edge region Ca and the second edge region Cb is lower than the acoustic velocity in the central region B. Here, V1>V2 is satisfied where V1 is the acoustic velocity in the central region B, and V2 is the acoustic velocity in the first edge region Ca and the second edge region Cb. The electrode finger widths of portions of the first electrode fingers 14 and the second electrode fingers 16 in the first edge region Ca and the second edge region Cb may be more than the electrode finger widths of the other portions. In this case, the acoustic velocity V2 can be more effectively reduced. The electrode finger widths of the first electrode fingers 14 and the second electrode fingers 16 mean dimensions of the first electrode fingers 14 and the second electrode fingers 16 in the first direction X.

Of the first electrode fingers 14 and the second electrode fingers 16, only the first electrode fingers 14 are located in the first gap region Da. Of the first electrode fingers 14 and the second electrode fingers 16, only the second electrode fingers 16 are located in the second gap region Db. Consequently, the acoustic velocity in the first gap region Da and the second gap region Db is higher than the acoustic velocity in the central region B. Here, V3>V1 is satisfied where V3 is the acoustic velocity in the first gap region Da and the second gap region Db.

The mass addition films 8 are stacked above the entire or substantially the entire portions extending in the first direction X in the first inner busbar region Ea and the second inner busbar region Eb. Consequently, the acoustic velocity in the first inner busbar region Ea and the second inner busbar region Eb is lower than the acoustic velocity in the central region B. Here, V1>V4 is satisfied where V4 is the acoustic velocity in the first inner busbar region Ea and the second inner busbar region Eb.

The mass addition films 8 are not stacked in the first outer busbar region Ha and the second outer busbar region Hb. In the case where the piezoelectric substrate 2 has the structure according to the present preferred embodiment in which the high acoustic velocity film 4, the low acoustic velocity film 5, and the piezoelectric layer 6 are stacked, the acoustic velocity in the first outer busbar region Ha and the second outer busbar region Hb is higher than the acoustic velocity in the central region B. Here, due to the effect of a grating structure, V5>V1 is satisfied where V5 is the acoustic velocity in the first outer busbar region Ha and the second outer busbar region Hb.

In the acoustic wave device 1, the acoustic velocities satisfy relationships of V3>V1>V2 and V5>V1>V4. The acoustic wave device 1 thus uses a piston mode. Relationships among the acoustic velocities V1 to V5 are illustrated in FIG. 2. In FIG. 2, the more the positions of lines that represent respective speeds for the acoustic velocities V1 to V5 shift in the left direction, the higher the acoustic velocities. The acoustic wave device 1 according to the present preferred embodiment can effectively reduce or prevent a transverse mode by using the piston mode.

In the present preferred embodiment, the mass addition films 8 are preferably stacked above the interdigital transducer electrode 7 not only in the first edge region Ca and the second edge region Cb but also in the first inner busbar region Ea and the second inner busbar region Eb. This enables the transverse mode to be reduced or prevented with more certainty. This will now be described.

According to the present preferred embodiment, the mass addition films 8 are stacked in the above manner, and the piston mode in the acoustic wave device 1 is produced by the relationships among the acoustic velocities of not only V3>V1>V2 but also V5>V1>V4. Accordingly, the degree of dependence of the production of the piston mode on the first edge region Ca and the second edge region Cb can be reduced.

In practice, the shapes of portions near the ends of the first electrode fingers 14 and the second electrode fingers 16 and the shapes of the mass addition films 8 have manufacturing variations. Accordingly, there are variations in the widths of the first edge region Ca and the second edge region Cb and the acoustic velocity V2. The widths of the first edge region Ca and the second edge region Cb mean dimensions of the first edge region Ca and the second edge region Cb in the second direction Y. According to the present preferred embodiment, however, the degree of dependence of the production of the piston mode on the first edge region Ca and the second edge region Cb can be reduced. Accordingly, the transverse mode can be reduced or prevented with more certainty even when there are the variations described above.

In the following description, the first preferred embodiment and a first comparative example are compared to describe the advantageous effects according to the first preferred embodiment in detail. The first comparative example differs from the first preferred embodiment in that the mass addition films are not disposed in a region other than the first edge region and the second edge region.

Figure 4:
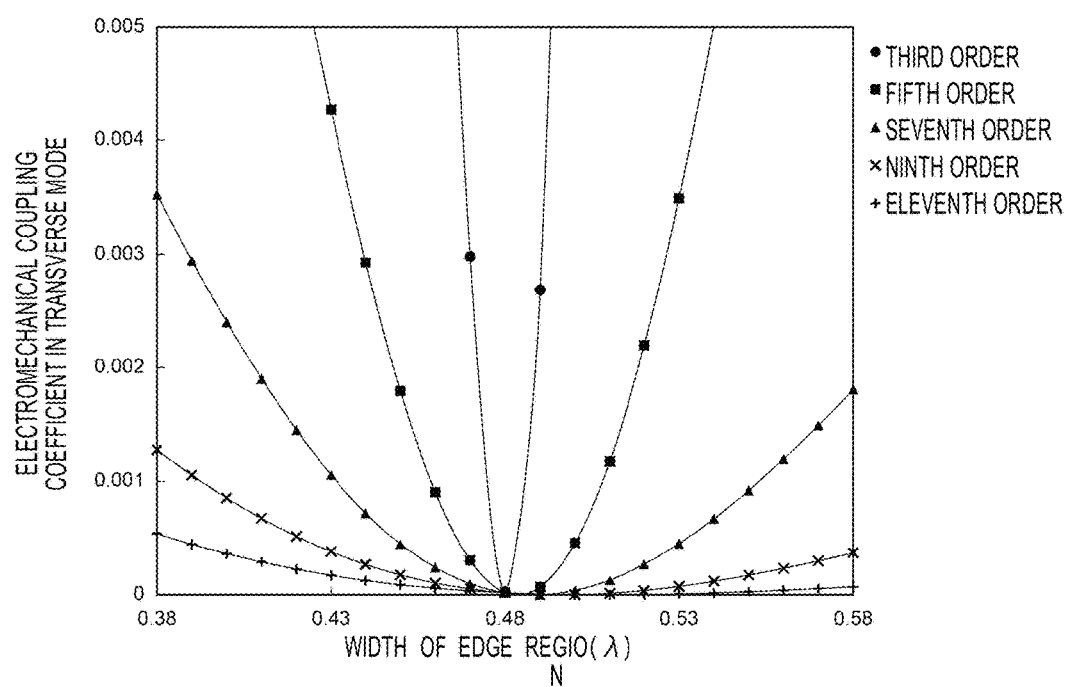
FIG. 4 illustrates relationships between the widths of edge regions and an electromechanical coupling coefficient in transverse modes in a first comparative example.
Figure 5:
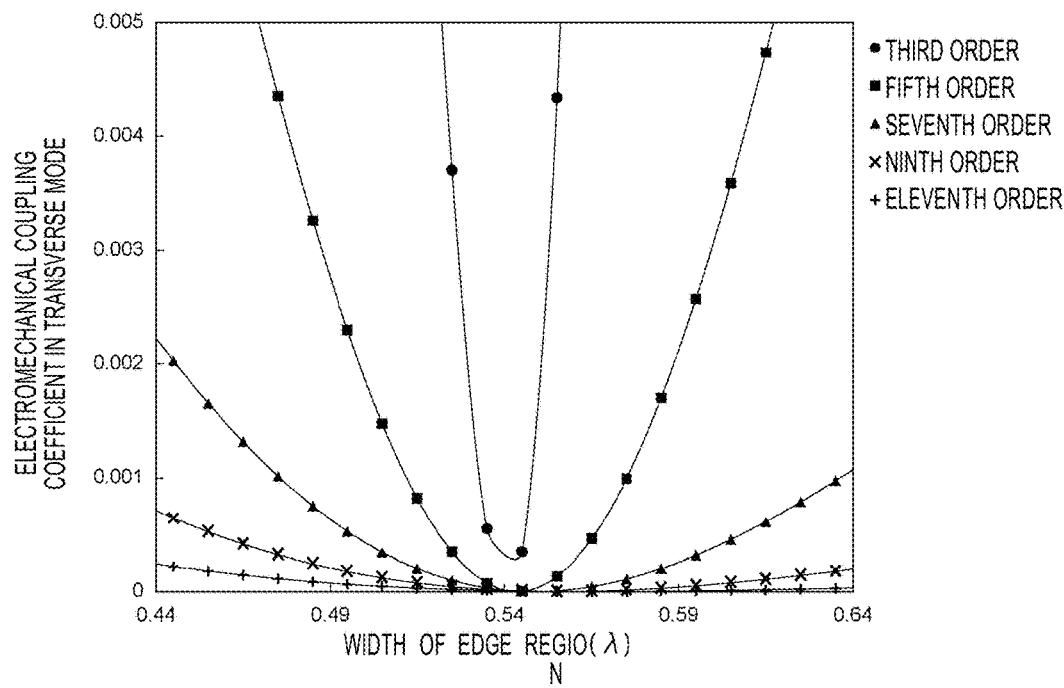
FIG. 5 illustrates relationships between the widths of edge regions and the electromechanical coupling coefficient in the transverse modes according to the first preferred embodiment of the present invention.

FIG. 4 and FIG. 5 described later illustrate relationships between the widths of the first edge region and the second edge region and an electromechanical coupling coefficient in third-order, fifth-order, seventh-order, ninth-order, and eleventh-order transverse modes. In FIG. 4 and FIG. 5, the widths of the first edge region and the second edge region are illustrated as the widths of the edge regions. The wavelength that is defined by the electrode finger pitch of the interdigital transducer electrode is denoted λ. The widths of the edge regions are illustrated based on the wavelength λ.

FIG. 4 illustrates the relationships between the widths of the edge regions and the electromechanical coupling coefficient in the transverse modes in the first comparative example. FIG. 5 illustrates the relationships between the widths of the edge regions and the electromechanical coupling coefficient in the transverse modes according to the first preferred embodiment.

For example, the electromechanical coupling coefficient in the seventh-order transverse mode is compared between FIG. 4 and FIG. 5. According to the first preferred embodiment, the electromechanical coupling coefficient can be reduced over a wider range of the width of each edge region than in the first comparative example. Similarly, it can be seen that according to the first preferred embodiment, the electromechanical coupling coefficient in the third-order, fifth-order, ninth-order, and eleventh-order transverse modes can be reduced over a wider range of the width of each edge region, and the transverse modes can be sufficiently reduced or prevented. According to the first preferred embodiment, the degree of dependence of the electromechanical coupling coefficient on the first edge region Ca and the second edge region Cb can thus be reduced. Accordingly, the transverse modes can be reduced or prevented with more certainty even when there are the variations in the widths of the first edge region Ca and the second edge region Cb.

Figure 6:
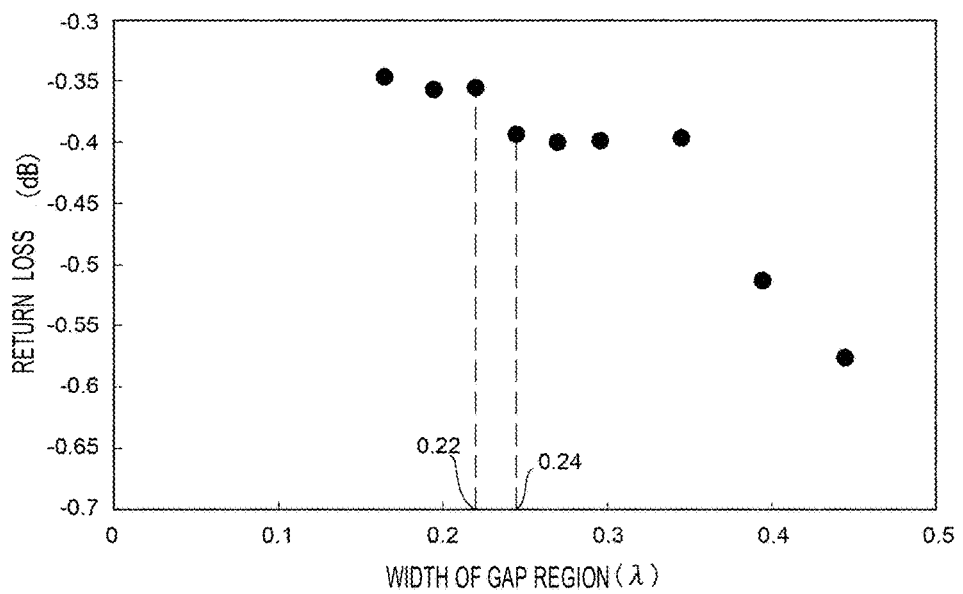
FIG. 6 illustrates relationships between the widths of gap regions and a return loss in the acoustic wave device according to the first preferred embodiment of the present invention.

In FIG. 6 described later, the widths of the first gap region Da and the second gap region Db mean the dimensions of the first gap region Da and the second gap region Db in the second direction Y, and relationships between the widths of the gap regions and a return loss are illustrated. In FIG. 6 described later, the widths of the first gap region Da and the second gap region Db are illustrated as the widths of the gap regions.

FIG. 6 illustrates the relationships between the widths of the gap regions and the return loss in the acoustic wave device according to the first preferred embodiment.

As illustrated in FIG. 6, when the widths of the gap regions are about 0.24λ or more, the absolute value of the return loss increases. Accordingly, it can be seen that when the widths of the gap regions are about 0.23λ or less, the absolute value of the return loss decreases. The widths of the gap regions are preferably about 0.2λ or less, for example. This enables the absolute value of the return loss to decrease with more certainty. In addition, the size of the acoustic wave device 1 can be reduced.

First to fourth modifications to the first preferred embodiment will now be described. Also, according to the first to fourth modifications, the degree of dependence of the production of the piston mode on the first edge region Ca and the second edge region Cb can be reduced, and the transverse modes can be reduced or prevented with more certainty, as in the first preferred embodiment.

Figure 7:
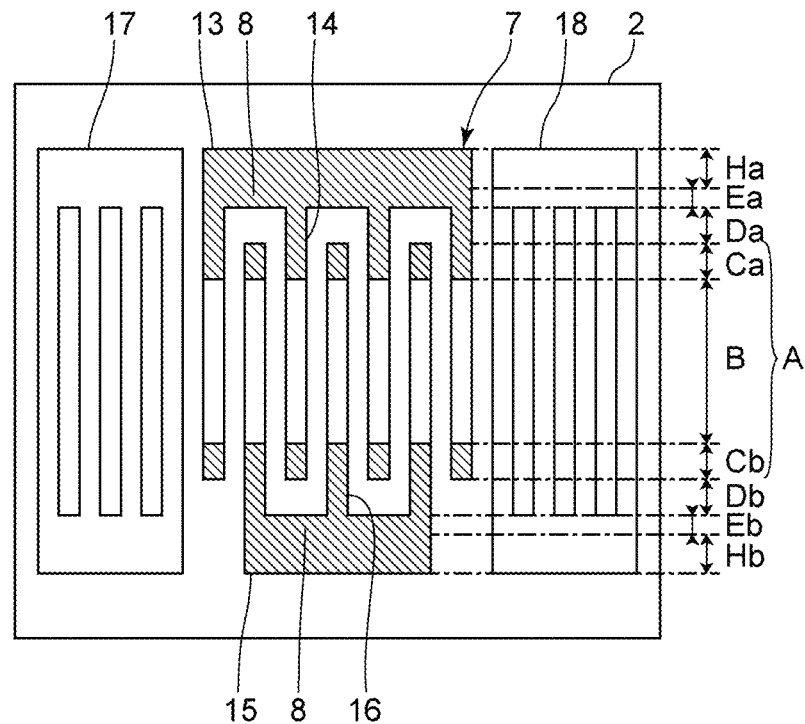
FIG. 7 is a plan view of an acoustic wave device according to a first modification to the first preferred embodiment of the present invention.

FIG. 7 is a plan view of an acoustic wave device according to the first modification to the first preferred embodiment.

The present modification differs from the first preferred embodiment in that the mass addition films 8 are stacked above the interdigital transducer electrode 7 in the first outer busbar region Ha and the second outer busbar region Hb. The film thicknesses of the mass addition films 8, for example, may be differentiated between on the first outer busbar region Ha and on the first inner busbar region Ea such that the acoustic velocities are differentiated. The same is true for the second outer busbar region Hb and the first inner busbar region Eb.

Figure 8:
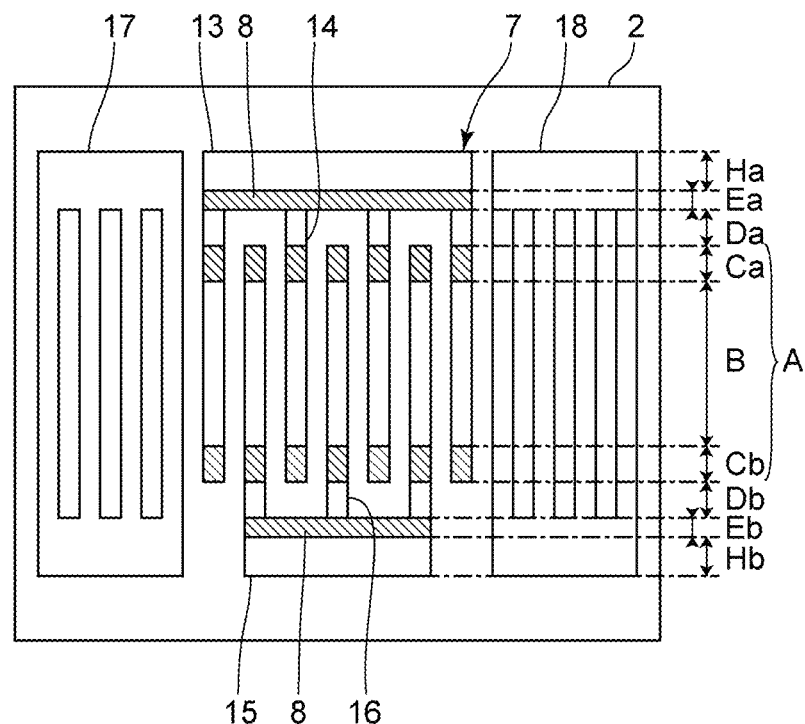
FIG. 8 is a plan view of an acoustic wave device according to a second modification to the first preferred embodiment of the present invention.

FIG. 8 is a plan view of an acoustic wave device according to the second modification to the first preferred embodiment.

The present modification differs from the first preferred embodiment in that the mass addition films 8 are not stacked above the interdigital transducer electrode 7 in the first gap region Da and the second gap region Db.

Figure 9:
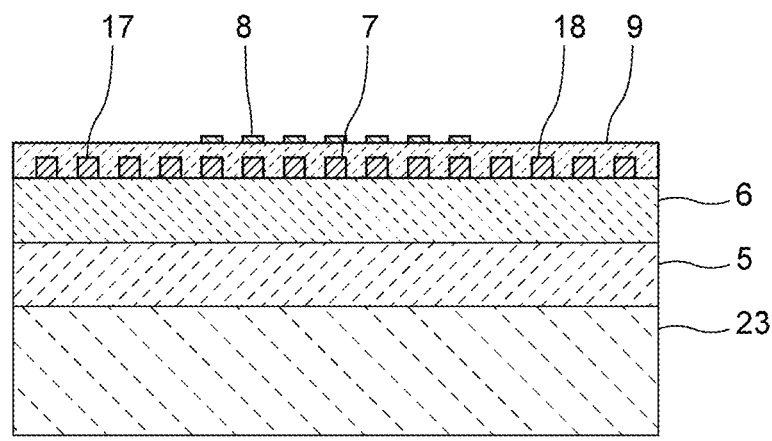
FIG. 9 is a sectional front view of an acoustic wave device according to a third modification to the first preferred embodiment of the present invention.

FIG. 9 is a sectional front view of an acoustic wave device according to the third modification to the first preferred embodiment.

The present modification differs from the first preferred embodiment in that a support substrate 23 is a high acoustic velocity member, and the high acoustic velocity film is not provided. In this case, examples of the material of the support substrate 23 as the high acoustic velocity member include piezoelectric materials such as lithium tantalate, lithium niobate, and crystal, ceramics such as alumina, zirconia, cordierite, mullite, steatite, and forsterite, aluminum nitride, aluminum oxide, silicon carbide, silicon nitride, silicon oxynitride, silicon, a DLC film, silicon, sapphire, diamond, magnesia, a material that includes any of the above materials as a main component, and a material that includes a mixture of any of the above materials as a main component. It suffices that the material of the high acoustic velocity member is a material that has a relatively high acoustic velocity.

Also, the acoustic wave device according to the present modification has a structure including the support substrate 23 as the high acoustic velocity member, the low acoustic velocity film 5, and the piezoelectric layer 6 that are stacked and can effectively confine the energy of the acoustic wave within the piezoelectric layer 6 or the vicinity thereof.

Figure 10:
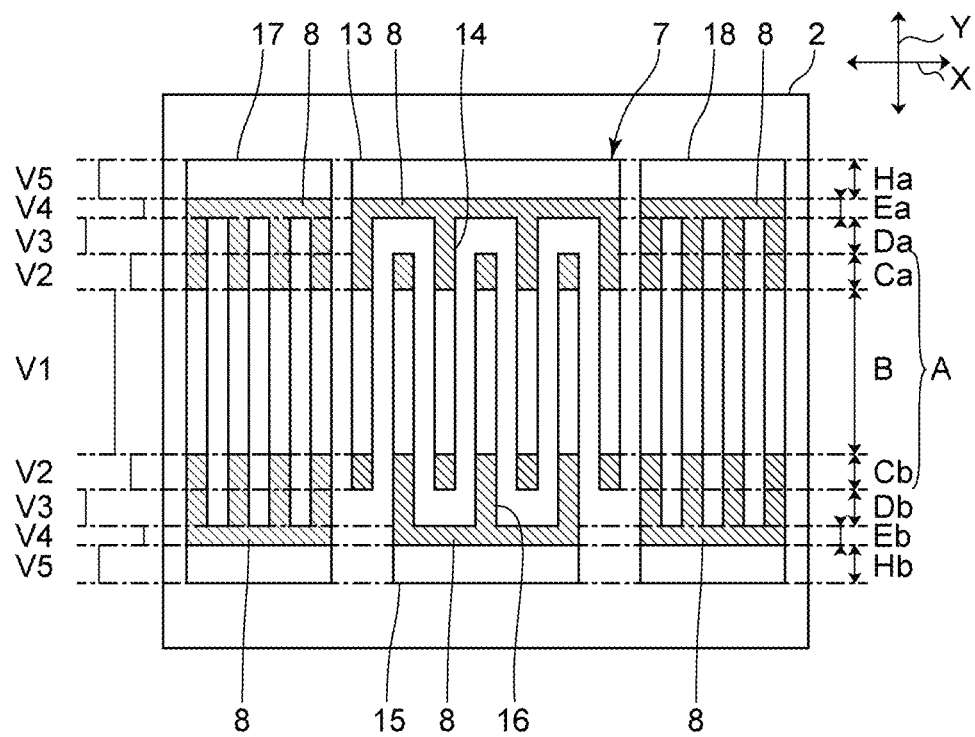
FIG. 10 is a plan view of an acoustic wave device according to a fourth modification to the first preferred embodiment of the present invention.

FIG. 10 is a plan view of an acoustic wave device according to the fourth modification to the first preferred embodiment.

The present modification differs from the first preferred embodiment in that the mass addition films 8 are stacked above the reflector 17 and the reflector 18. The positions of the mass addition films 8 above the reflector 17 and the reflector 18 in the second direction Y are preferably the same or substantially the same as the positions of the mass addition films 8 above the interdigital transducer electrode 7 in the second direction Y.

Figure 11:
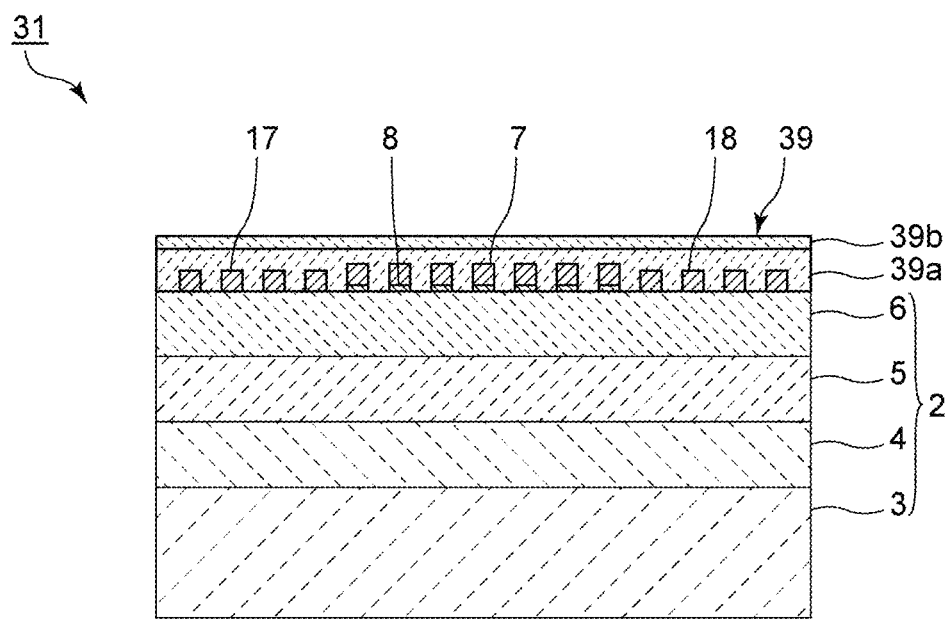
FIG. 11 is a sectional front view of an acoustic wave device according to a second preferred embodiment of the present invention.
Figure 12:
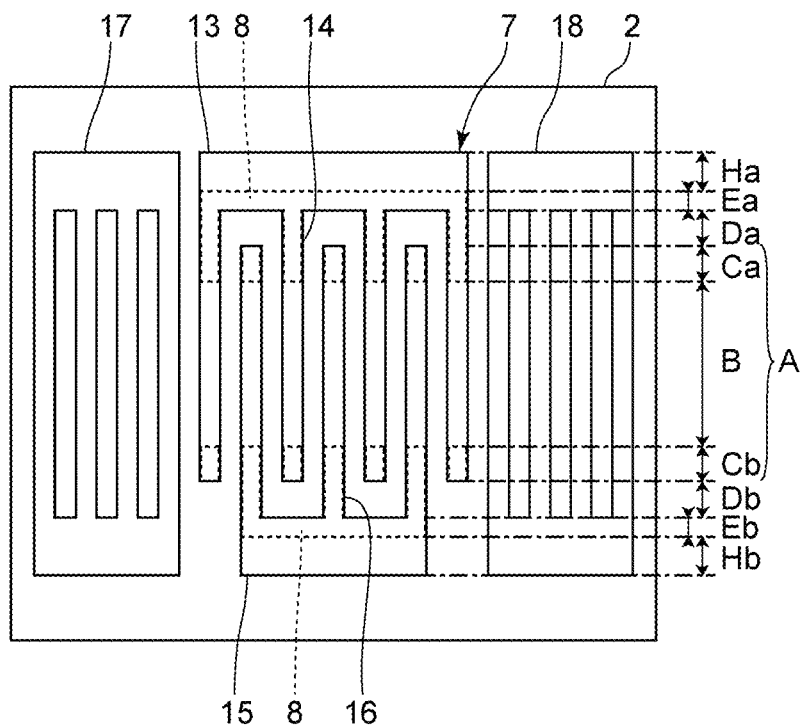
FIG. 12 is a plan view of the acoustic wave device according to the second preferred embodiment of the present invention.

FIG. 11 is a sectional front view of an acoustic wave device according to a second preferred embodiment of the present invention. FIG. 12 is a plan view of the acoustic wave device according to the second preferred embodiment. FIG. 11 illustrates a section of the first edge region.

As illustrated in FIG. 11 and FIG. 12, the present preferred embodiment differs from the first preferred embodiment in that the piezoelectric substrate 2, the mass addition films 8, and the interdigital transducer electrode 7 are stacked in this order, and a dielectric film 39 is a multilayer film. Other than these, an acoustic wave device 31 according to the present preferred embodiment has the same or substantially the same structure as that of the acoustic wave device 1 according to the first preferred embodiment.

Also, according to the present preferred embodiment, the degree of dependence of the production of the piston mode on the first edge region Ca and the second edge region Cb can be reduced, and the transverse modes can be reduced or prevented with more certainty, as in the first preferred embodiment.

The dielectric film 39 includes a first layer 39a that is disposed near the piezoelectric substrate 2 and a second layer 39b that is stacked on the first layer 39a. The first layer 39a is preferably made of, for example, $SiO_2$. The second layer 39b is preferably made of, for example, SiN. The materials of the first layer 39a and the second layer 39b are not limited to the above description. The dielectric film 39 may include a single layer as in the first preferred embodiment.

According to the present preferred embodiment, the second layer 39b is a frequency adjustment film and can adjust the frequency of the acoustic wave device 31 by adjusting the film thickness. According to the present preferred embodiment, the mass addition films 8 are disposed between the piezoelectric substrate 2 and the interdigital transducer electrode 7. Consequently, when the film thickness of the frequency adjustment film is adjusted, the film thicknesses of the mass addition films 8 are unlikely to change, and the production of the piston mode is unlikely to be affected. Accordingly, the frequency can be readily adjusted, and the transverse modes can be reduced or prevented with more certainty.

Figure 13:
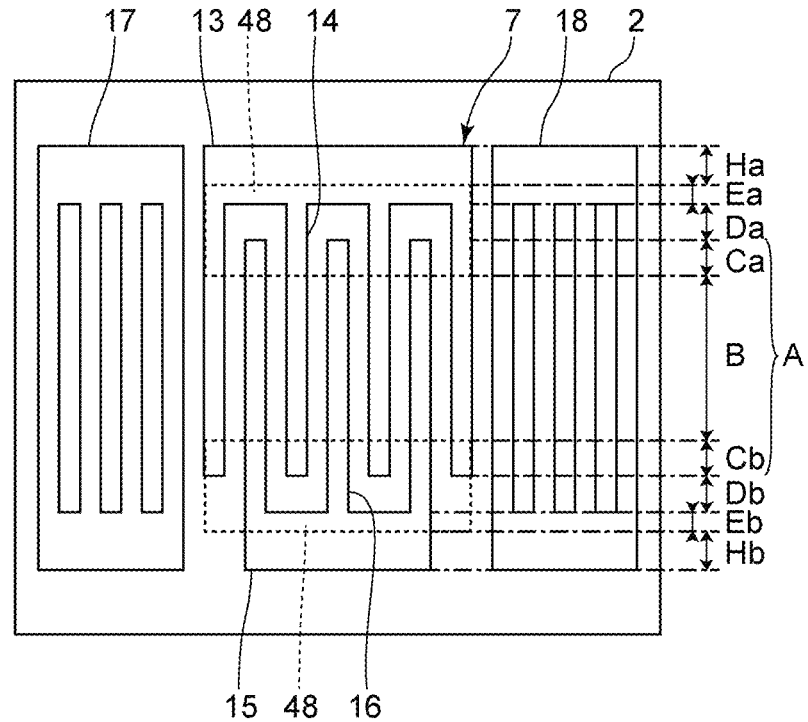
FIG. 13 is a plan view of an acoustic wave device according to a modification to the second preferred embodiment of the present invention.

FIG. 13 is a plan view of an acoustic wave device according to a modification to the second preferred embodiment.

According to the present modification, mass addition films 48 are made of a dielectric material. In a plan view, a mass addition film 48 overlaps the entire or substantially the entire surface in the first edge region Ca, the first gap region Da, and the first inner busbar region Ea in addition to a region in which the metal film of the interdigital transducer electrode 7 is not provided. Similarly, in a plan view, a mass addition film 48 overlaps the entire or substantially the entire surface in the second edge region Cb, the second gap region Db, and the second inner busbar region Eb in addition to a region in which the metal film is not provided.

According to the present modification, in a plan view, the shapes of the mass addition films 48 are rectangular or substantially rectangular. Accordingly, complex patterning is not needed to provide the mass addition films 48, and productivity can be improved. In addition, the degree of dependence of the production of the piston mode on the first edge region Ca and the second edge region Cb can be reduced, and the transverse modes can be reduced or prevented with more certainty, as in the second preferred embodiment.

The mass addition films 48 may be made of metal. In this case, it suffices that a dielectric material layer is disposed between each mass addition film 48 and the interdigital transducer electrode 7.

Figure 14:
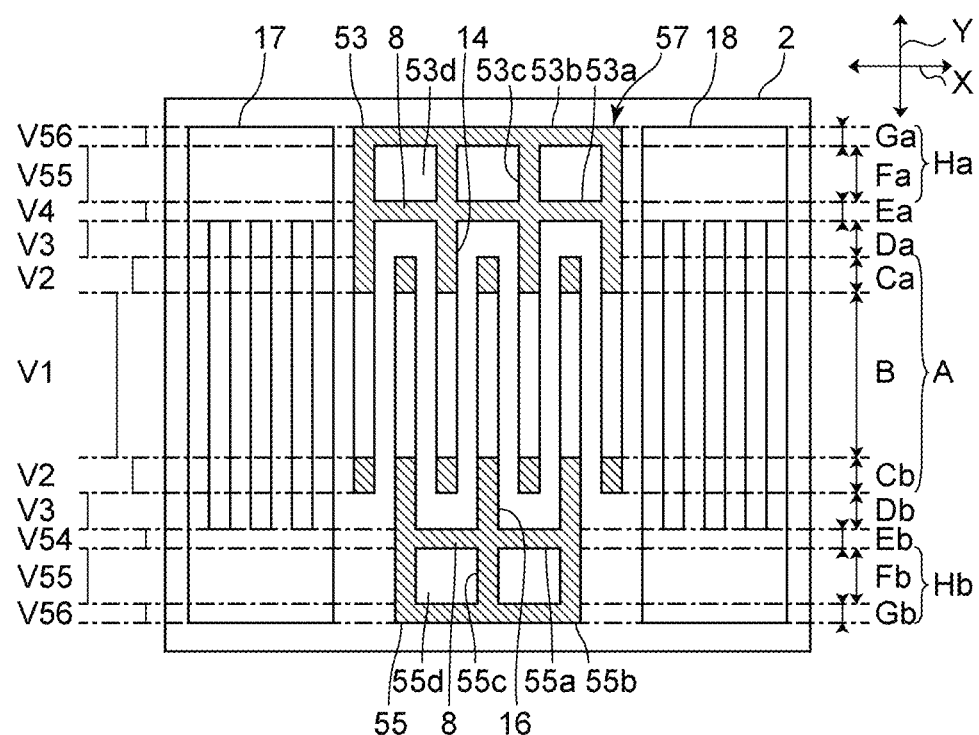
FIG. 14 is a plan view of an acoustic wave device according to a third preferred embodiment of the present invention.

FIG. 14 is a plan view of an acoustic wave device according to a third preferred embodiment of the present invention.

The present preferred embodiment differs from the first preferred embodiment in the structure of a first busbar 53 and a second busbar 55 of an interdigital transducer electrode 57. The present preferred embodiment differs from the first preferred embodiment also in that the mass addition films 8 are stacked above the interdigital transducer electrode 57 in the first outer busbar region Ha and the second outer busbar region Hb. Other than these, the acoustic wave device according to the present preferred embodiment has the same or substantially the same structure as that of the acoustic wave device 1 according to the first preferred embodiment.

The first outer busbar region Ha includes a first cavity formation region Fa in which cavities 53d are arranged in the first direction X and a first outermost region Ga that is located outside the first cavity formation region Fa in the second direction Y. The first inner busbar region Ea and the first cavity formation region Fa are connected to each other. The first cavity formation region Fa and the first outermost region Ga are connected to each other.

More specifically, the first busbar 53 includes an inner busbar portion 53a that is located adjacent the first gap region Da and that extends in the first direction X. The first busbar 53 includes an outer busbar portion 53b that is disposed separately from the inner busbar portion 53a with the cavities 53d interposed therebetween and that extends in the first direction X. The first busbar 53 includes connectors 53c that connect the inner busbar portion 53a and the outer busbar portion 53b to each other. The cavities 53d are surrounded by the inner busbar portion 53a, the outer busbar portion 53b, and two of the connectors 53c. According to the present preferred embodiment, the connectors 53c are located on extension lines from the first electrode fingers 14. The positions of the connectors 53c are not limited to the above description.

According to the present preferred embodiment, in the first inner busbar region Ea, the inner busbar portion 53a is located. In the first outermost region Ga of the first outer busbar region Ha, the outer busbar portion 53b is located.

The second outer busbar region Hb includes a second cavity formation region Fb in which cavities 55d are arranged in the first direction X and a second outermost region Gb that is located outside the second cavity formation region Fb in the second direction Y. The second inner busbar region Eb and the second cavity formation region Fb are connected to each other. The second cavity formation region Fb and the second outermost region Gb are connected to each other.

The second busbar 55 includes an inner busbar portion 55a, an outer busbar portion 55b, and connectors 55c as in the first busbar 53. In the second inner busbar region Eb, the inner busbar portion 55a is located. In the second outermost region Gb of the second outer busbar region Hb, the outer busbar portion 55b is located.

In the first cavity formation region Fa, the cavities 53d are arranged as described above. The acoustic velocity in the first cavity formation region Fa that is a portion of the first outer busbar region Ha is higher than the acoustic velocity V1 in the central region B. Similarly, in the second cavity formation region Fb, the cavities 55d are arranged. Consequently, the acoustic velocity in the second cavity formation region Fb that is a portion of the second outer busbar region Hb is higher than the acoustic velocity V1 in the central region B. Here, V55>V1 is satisfied where V55 is the acoustic velocity in the first cavity formation region Fa and the second cavity formation region Fb.

In the first outermost region Ga and the second outermost region Gb, the mass addition films 8 are stacked above the entire or substantially the entire portions extending in the first direction X as in the first inner busbar region Ea. Consequently, the acoustic velocity in the first outermost region Ga and the second outermost region Gb is lower than the acoustic velocity in the central region B. Here, V1>V56 is satisfied where V56 is the acoustic velocity in the first outermost region Ga and the second outermost region Gb.

According to the present preferred embodiment, the acoustic velocities satisfy a relationship of V55=V3>V1>V2>V4=V56. The acoustic velocities also satisfy relationships of not only V3>V1>V2 but also V55>V1>V4. Accordingly, the degree of dependence of the production of the piston mode on the first edge region Ca and the second edge region Cb can be reduced, and the transverse modes can be reduced or prevented with more certainty, as in the first preferred embodiment.

In addition, in the first inner busbar region Ea, not only the metal film of the interdigital transducer electrode 57 is disposed entirely or substantially entirely in the first direction X, but also the mass addition films 8 are stacked entirely or substantially entirely in the first direction X. Accordingly, in the first inner busbar region Ea, the acoustic velocity can be further reduced. The same is true for the second inner busbar region Eb. Accordingly, the transverse modes can be reduced or prevented with more certainty.

Also, according to the third preferred embodiment, the widths of the first gap region Da and the second gap region Db are preferably about 0.2λ or less, for example. This enables the absolute value of the return loss to be decreased with more certainty and enables the size of the acoustic wave device 1 to be reduced. According to the present preferred embodiment, the acoustic velocity V55 in the first cavity formation region Fa and the second cavity formation region Fb is high. This enables the degree of dependence of the production of the piston mode on the first gap region Da and the second gap region Db to be reduced. Accordingly, even when the widths of the first gap region Da and the second gap region Db are about 0.2λ or less, the piston mode is appropriately produced, and the transverse modes can be reduced or prevented.

Figure 15:
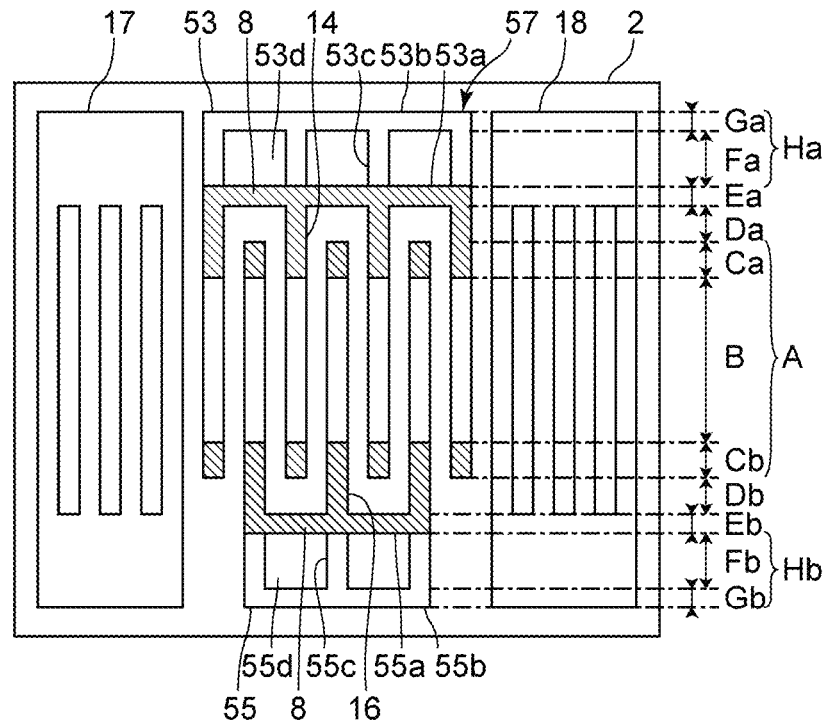
FIG. 15 is a plan view of an acoustic wave device according to a first modification to the third preferred embodiment of the present invention.

FIG. 15 is a plan view of an acoustic wave device according to a first modification to the third preferred embodiment.

The present modification differs from the first preferred embodiment in that the mass addition films 8 are not stacked above the interdigital transducer electrode 57 in the first outer busbar region Ha and the second outer busbar region Hb. Also, in this case, the degree of dependence of the production of the piston mode on the first edge region Ca and the second edge region Cb can be reduced, and the transverse modes can be reduced or prevented with more certainty, as in the third preferred embodiment.

Figure 16:
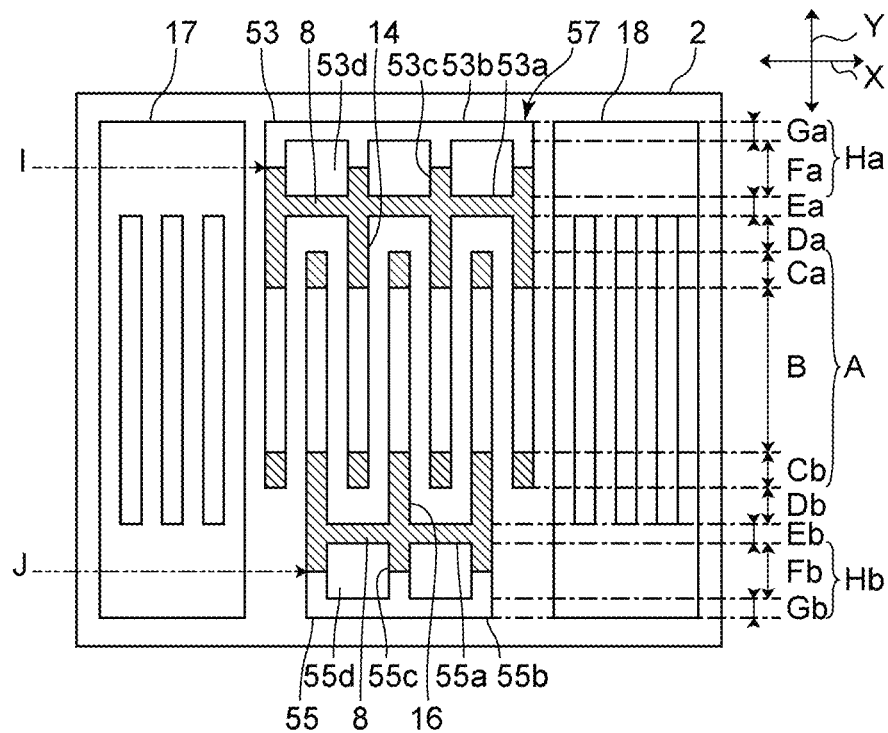
FIG. 16 is a plan view of an acoustic wave device according to a second modification to the third preferred embodiment of the present invention.

FIG. 16 is a plan view of an acoustic wave device according to a second modification to the third preferred embodiment of the present invention.

The present modification differs from the third preferred embodiment in that the mass addition films 8 are not stacked above the interdigital transducer electrode 57 in the first outermost region Ga, the second outermost region Gb, a portion of the first cavity formation region Fa, and a portion of the second cavity formation region Fb. Other than these, the acoustic wave device according to the present modification has the same or substantially the same structure as that of the acoustic wave device according to the third preferred embodiment.

More specifically, the mass addition films 8 are stacked above the interdigital transducer electrode 57 in a region that extends in the second direction Y from a position at which the first cavity formation region Fa is connected to the first inner busbar region Ea to a position illustrated by an arrow I. However, the mass addition films 8 are not stacked above the interdigital transducer electrode 57 in a region that extends from the position illustrated by the arrow I including the first outermost region Ga.

Similarly, the mass addition films 8 are stacked above the interdigital transducer electrode 57 in a region that extends in the second direction Y from a position at which the second cavity formation region Fb is connected to the second inner busbar region Eb to a position illustrated by an arrow J. However, the mass addition films 8 are not stacked above the interdigital transducer electrode 57 in a region that extends from the position illustrated by the arrow J including the second outermost region Gb. Also, according to the present modification, the degree of dependence of the production of the piston mode on the first edge region Ca and the second edge region Cb can be reduced, and the transverse modes can be reduced or prevented with more certainty, as in the third preferred embodiment.

Figure 17:
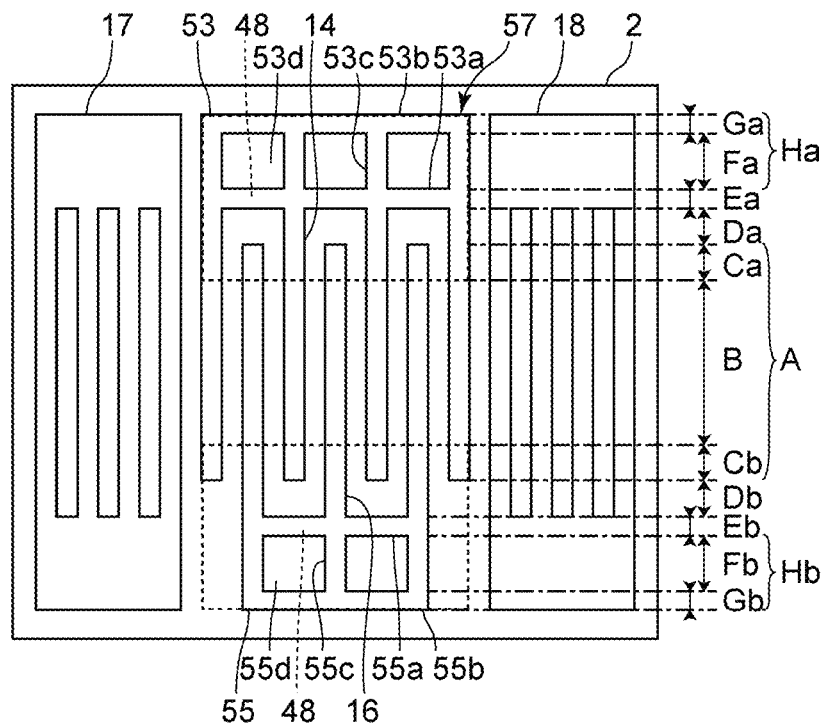
FIG. 17 is a plan view of an acoustic wave device according to a fourth preferred embodiment of the present invention.

FIG. 17 is a plan view of an acoustic wave device according to a fourth preferred embodiment of the present invention.

The present preferred embodiment differs from the third preferred embodiment in that the piezoelectric substrate 2, mass addition films 48, and the interdigital transducer electrode 57 are stacked in this order. A range in which each mass addition film 48 is stacked above the piezoelectric substrate 2 also differs from that according to the third preferred embodiment. Other than these, the acoustic wave device according to the present preferred embodiment has the same or substantially the same structure as that of the acoustic wave device according to the third preferred embodiment.

More specifically, in a plan view, a mass addition film 48 overlaps the entire or substantially the entire surface in the first edge region Ca, the first gap region Da, the first inner busbar region Ea, and the first outer busbar region Ha in addition to a region in which the metal film of the interdigital transducer electrode 57 is not provided. Similarly, in a plan view, a mass addition film 48 overlaps the entire or substantially the entire surface in the second edge region Cb, the second gap region Db, the second inner busbar region Eb, and the second outer busbar region Hb in addition to a region in which the metal film is not provided. In the case where the mass addition films 48 are preferably made of metal, it suffices that a dielectric material layer, for example, is disposed between each mass addition film 48 and the interdigital transducer electrode 57.

Also, according to the present preferred embodiment, the degree of dependence of the production of the piston mode on the first edge region Ca and the second edge region Cb can be reduced, and the transverse modes can be reduced or prevented with more certainty, as in the third preferred embodiment. In addition, productivity can be improved.

Figure 18:
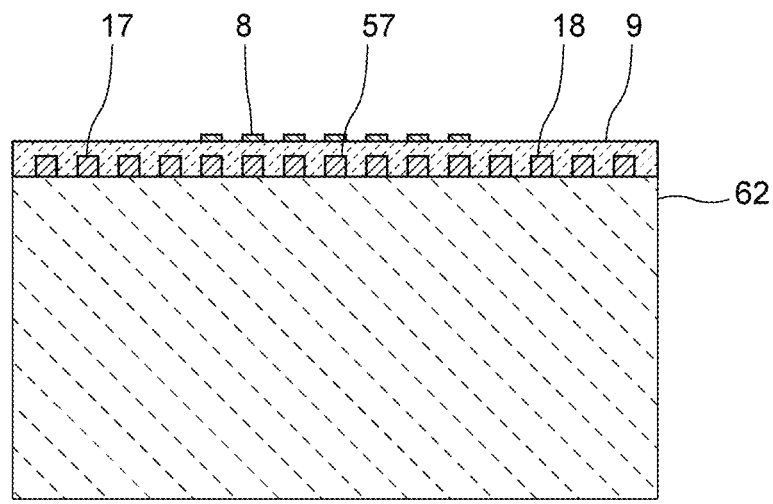
FIG. 18 is a sectional front view of an acoustic wave device according to a fifth preferred embodiment of the present invention.
Figure 19:
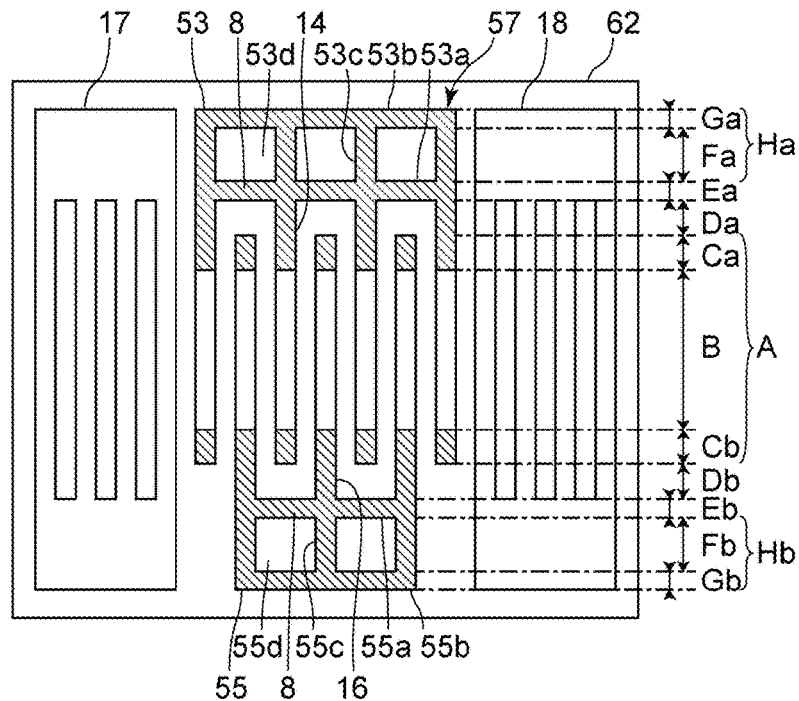
FIG. 19 is a plan view of the acoustic wave device according to the fifth preferred embodiment of the present invention.

FIG. 18 is a sectional front view of an acoustic wave device according to a fifth preferred embodiment of the present invention. FIG. 19 is a plan view of the acoustic wave device according to the fifth preferred embodiment.

As illustrated in FIG. 18 and FIG. 19, the present preferred embodiment differs from the third preferred embodiment in that a piezoelectric substrate 62 is a piezoelectric substrate that includes only a piezoelectric layer. Other than these, the acoustic wave device according to the present preferred embodiment has the same or substantially the same structure as that of the acoustic wave device according to the third preferred embodiment.

The piezoelectric substrate 62 is preferably made of, for example, lithium niobate. The reverse-velocity surface of the piezoelectric substrate 62 is convex.

Also, according to the present preferred embodiment, the degree of dependence of the production of the piston mode on the first edge region Ca and the second edge region Cb can be reduced, and the transverse modes can be reduced or prevented with more certainty, as in the third preferred embodiment.

In the following description, the fifth preferred embodiment and a second comparative example are compared to describe the advantageous effects according to the fifth preferred embodiment in detail. The second comparative example differs from the fifth preferred embodiment in that the mass addition films are not disposed in a region other than the first edge region and the second edge region.

Figure 20:
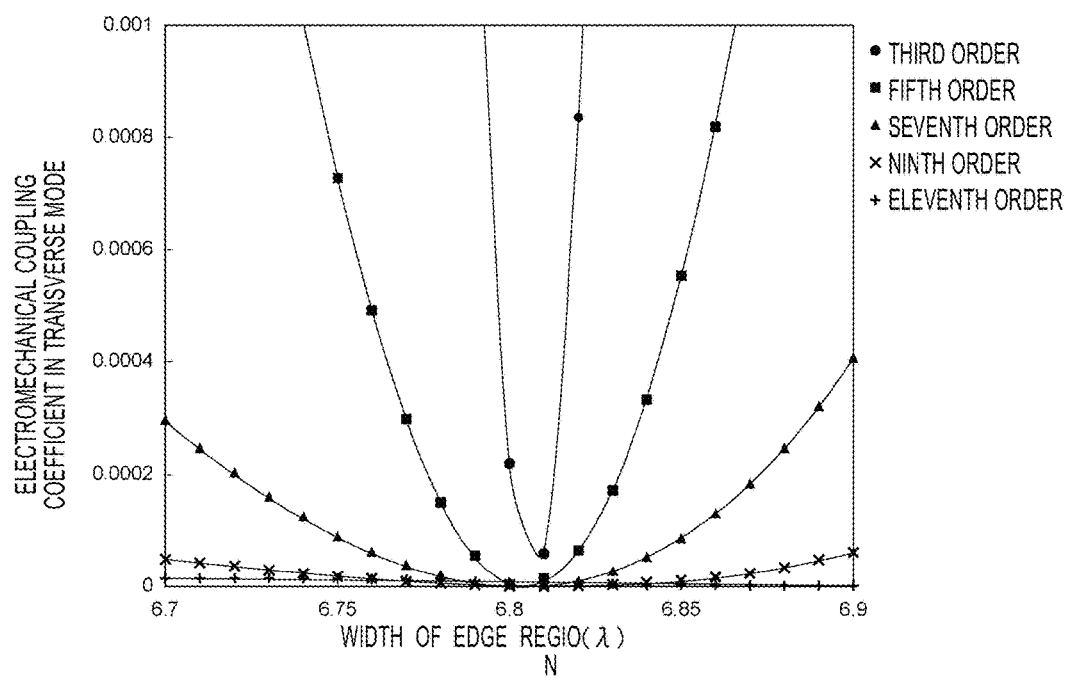
FIG. 20 illustrates relationships between the widths of the edge regions and the electromechanical coupling coefficient in the transverse modes in a second comparative example.
Figure 21:
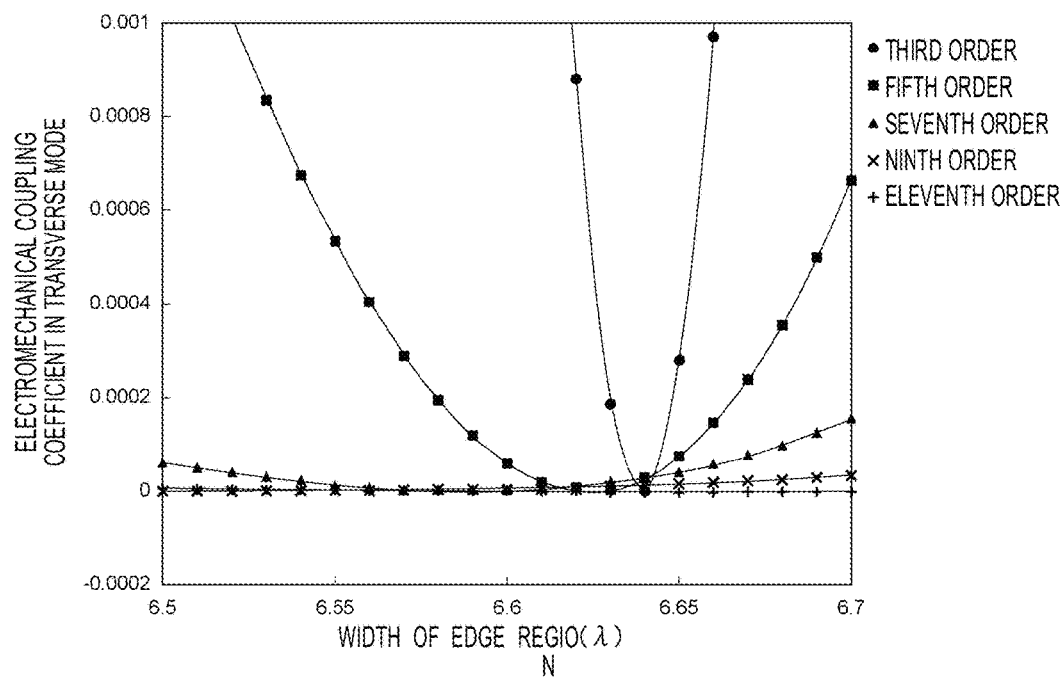
FIG. 21 illustrates relationships between the widths of the edge regions and the electromechanical coupling coefficient in the transverse modes according to the fifth preferred embodiment of the present invention.

FIG. 20 and FIG. 21 described later illustrate relationships between the widths of the first edge region and the second edge region and the electromechanical coupling coefficient in the third-order, fifth-order, seventh-order, ninth-order, and eleventh-order transverse modes. In FIG. 20 and FIG. 21, the widths of the first edge region and the second edge region are illustrated as the widths of the edge regions.

FIG. 20 illustrates the relationships between the widths of the edge regions and the electromechanical coupling coefficient in the transverse modes in the second comparative example. FIG. 21 illustrates the relationships between the widths of the edge regions and the electromechanical coupling coefficient in the transverse modes according to the fifth preferred embodiment.

As illustrated in FIG. 20 and FIG. 21, it can be seen that according to the fifth preferred embodiment, the electromechanical coupling coefficient in the third-order, fifth-order, seventh-order, ninth-order, and eleventh-order transverse modes can be reduced over a wider range of the width of each edge region than in the second comparative example. It can be seen that the transverse modes can be sufficiently reduced or prevented according to the fifth preferred embodiment. According to the fifth preferred embodiment, the degree of dependence of the electromechanical coupling coefficient on the first edge region Ca and the second edge region Cb can thus be reduced. Accordingly, the transverse modes can be reduced or prevented with more certainty even when there are the variations in the widths of the first edge region Ca and the second edge region Cb.

Even when the piezoelectric substrate 62 is the piezoelectric substrate, it suffices that the mass addition films 8 are stacked above the interdigital transducer electrode 57 in at least the first edge region Ca, the second edge region Cb, the first inner busbar region Ea, and the second inner busbar region Eb. The piezoelectric substrate 62, the mass addition films 8, and the interdigital transducer electrode 57 may be stacked in this order. In a plan view, the mass addition films 8 may overlap regions including a region in which the metal film of the interdigital transducer electrode 57 is not provided, other than the central region B. The first busbar 53 and the second busbar 55 may not include the cavities 53d and the cavities 55d as in the first preferred embodiment.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An acoustic wave device comprising:
   a piezoelectric substrate a reverse-velocity surface of which is convex;
   an interdigital transducer electrode disposed on the piezoelectric substrate; and
   a mass addition film stacked above a portion of the interdigital transducer electrode; wherein
   the interdigital transducer electrode includes a first busbar and a second busbar that face each other, first electrode fingers each of which includes an end connected to the first busbar, and second electrode fingers each of which includes an end connected to the second busbar, the second electrode fingers being interdigitated with respect to the first electrode fingers;

an intersection region is defined as a region in which the first electrode fingers and the second electrode fingers overlap in a first direction, where the first direction is a direction in which an acoustic wave propagates, and a second direction is a direction perpendicular or substantially perpendicular to the first direction;

the intersection region includes a central region located at a center or approximate center in the second direction, a first edge region located between the central region and the first busbar, and a second edge region located between the central region and the second busbar;

the interdigital transducer electrode includes a first gap region located between the first edge region and the first busbar, and a second gap region located between the second edge region and the second busbar;

the first busbar includes a first inner busbar region located adjacent the first gap region and a first outer busbar region located outside the first inner busbar region in the second direction, and the second busbar includes a second inner busbar region located adjacent the second gap region and a second outer busbar region located outside the second inner busbar region in the second direction;

the mass addition film is stacked in at least the first edge region, the second edge region, the first inner busbar region, and the second inner busbar region;

an acoustic velocity in the first edge region and the second edge region is lower than an acoustic velocity in the central region;

an acoustic velocity in the first gap region and the second gap region is higher than the acoustic velocity in the central region;

an acoustic velocity in the first inner busbar region and the second inner busbar region is lower than the acoustic velocity in the central region; and an acoustic velocity in at least a portion of the first outer busbar region and at least a portion of the second outer busbar region is higher than the acoustic velocity in the central region.

2. The acoustic wave device according to claim 1, wherein the piezoelectric substrate includes only a piezoelectric layer and is made of lithium niobate.

3. The acoustic wave device according to claim 1, wherein the piezoelectric substrate includes a high acoustic velocity member, a low acoustic velocity film disposed on the high acoustic velocity member, and a piezoelectric layer disposed on the low acoustic velocity film;

an acoustic velocity of a bulk wave that propagates through the high acoustic velocity member is higher than an acoustic velocity of an acoustic wave that propagates through the piezoelectric layer; and an acoustic velocity of a bulk wave that propagates through the low acoustic velocity film is lower than the acoustic velocity of the bulk wave that propagates through the piezoelectric layer.

4. The acoustic wave device according to claim 3, further comprising:

a support substrate; wherein the high acoustic velocity member is a high acoustic velocity film disposed between the support substrate and the low acoustic velocity film.

5. The acoustic wave device according to claim 3, wherein the high acoustic velocity member is a support substrate.

6. The acoustic wave device according to claim 3, wherein the piezoelectric layer is made of lithium tantalate.

7. The acoustic wave device according to claim 1, wherein the first outer busbar region of the interdigital transducer electrode includes a first cavity formation region in which cavities are arranged in the first direction, and the second outer busbar region includes a second cavity formation region in which cavities are arranged in the first direction.

8. The acoustic wave device according to claim 1, wherein the first busbar and the second busbar of the interdigital transducer electrode include no cavity.

9. The acoustic wave device according to claim 1, wherein the mass addition film is stacked in the first gap region and the second gap region of the interdigital transducer electrode.

10. The acoustic wave device according to claim 1, wherein the piezoelectric substrate, the interdigital transducer electrode, and the mass addition film are stacked in this order.

11. The acoustic wave device according to claim 1, wherein the piezoelectric substrate, the mass addition film, and the interdigital transducer electrode are stacked in this order.

12. The acoustic wave device according to claim 1, wherein a dielectric film is disposed on the piezoelectric substrate and covers the interdigital transducer electrode.

13. The acoustic wave device according to claim 12, wherein the dielectric film is made of silicon oxide.

14. The acoustic wave device according to claim 1, wherein widths of the first gap region and the second gap region are about $0.2\lambda$ or less, wherein $\lambda$ is a wavelength that is defined by an electrode finger pitch of the interdigital transducer electrode, and the widths of the first gap region and the second gap region are dimensions of the first gap region and the second gap region in the second direction.

15. The acoustic wave device according to claim 1, further comprising:

a first reflector on a first side of the interdigital transducer electrode in the direction in which the acoustic wave propagates; and a second reflector on a second side of the interdigital transducer electrode opposite to the first side in the direction in which the acoustic wave propagates.

16. The acoustic wave device according to claim 1, wherein the mass addition film is stacked above entire or substantially entire portions extending in the first direction in the first inner busbar region and the second inner busbar region.

17. The acoustic wave device according to claim 1, wherein the mass addition film is not stacked in the first outer busbar region and the second outer busbar region.

18. The acoustic wave device according to claim 1, wherein the mass addition film is made of a dielectric material.

19. The acoustic wave device according to claim 1, wherein the mass addition film is made of metal.

* * * * *